(12) United States Patent
Lin et al.

(10) Patent No.: US 11,552,245 B2
(45) Date of Patent: Jan. 10, 2023

(54) CONDUCTIVE BRIDGE RANDOM ACCESS MEMORY AND METHOD OF MANUFACTURING THE SAME

(71) Applicant: Winbond Electronics Corp., Taichung (TW)

(72) Inventors: Chih-Yao Lin, Taichung (TW); Po-Yen Hsu, New Taipei (TW); Bo-Lun Wu, Tianzhong Township (TW)

(73) Assignee: WINDBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 16/803,351

(22) Filed: Feb. 27, 2020

(65) Prior Publication Data
US 2021/0273159 A1 Sep. 2, 2021

(51) Int. Cl.
*H01L 45/00* (2006.01)
*H01L 27/24* (2006.01)

(52) U.S. Cl.
CPC .......... *H01L 45/1226* (2013.01); *H01L 27/24* (2013.01); *H01L 45/1253* (2013.01); *H01L 45/146* (2013.01); *H01L 45/1675* (2013.01)

(58) Field of Classification Search
CPC ............. H01L 45/1233; H01L 45/1246; H01L 45/1683; H01L 27/24
See application file for complete search history.

(56) References Cited

U.S. PATENT DOCUMENTS

| | | | | |
|---|---|---|---|---|
| 7,471,555 B2* | 12/2008 | Lung | ...................... | H01L 45/06 257/E27.004 |
| 7,682,868 B2* | 3/2010 | Lung | ..................... | H01L 45/146 438/102 |
| 2010/0108975 A1* | 5/2010 | Sun | ........................ | H01L 45/085 257/4 |
| 2021/0193916 A1* | 6/2021 | Liu | ..................... | H01L 45/1246 |

FOREIGN PATENT DOCUMENTS

TW 201937497 A 9/2019

* cited by examiner

*Primary Examiner* — Mark V Prenty
(74) *Attorney, Agent, or Firm* — Birch, Stewart, Kolasch & Birch, LLP

(57) ABSTRACT

A conductive bridge random access memory and its manufacturing method are provided. The conductive bridge random access memory includes a bottom electrode, an inter-metal dielectric, a resistance switching assembly, and a top electrode. The bottom electrode is disposed on a substrate, and the inter-metal dielectric is disposed above the bottom electrode. The resistance switching assembly is disposed on the bottom electrode and positioned in the inter-metal dielectric. The resistance switching assembly has a reverse T-shape cross-section. The top electrode is disposed on the resistance switching assembly and the inter-metal dielectric.

15 Claims, 4 Drawing Sheets

CONDUCTIVE BRIDGE RANDOM ACCESS MEMORY AND METHOD OF MANUFACTURING THE SAME

BACKGROUND

Field of the Disclosure

The present disclosure relates to a memory structure, and in particular, it relates to a conductive bridge random access memory and method of manufacturing the same.

Description of the Related Art

There are several advantages to a conductive bridge random access memory (CBRAM), including its low operating voltage, high writing and erasing speeds, long retention time, capability for multi-bit storage, low power consumption, simple structure and fabrication, and expandable property. Therefore, a conductive bridge random access memory has great potential for replacing the current flash memory and for being the main non-volatile memory used in the next generation.

Conductive bridge random access memory includes several memory structures, and each of the memory structures mainly includes two electrodes and a resistance-switching layer sandwiched between the two electrodes. When the memory structure is under the set operation, the metal ions of the electrode diffuse into the resistance-switching layer to form a conductive path (formed by conductive filaments) between the two electrodes, thereby forming a low resistance state (LRS). When the memory structure is under the reset operation, the conductive path is disrupted, and the memory structure performs a switch from the low resistance state (LRS) to a high resistance state (HRS). Also, the low resistance state (LRS) and the high resistance state (HRS) respectively denote the digital signals of "1" and "0", thereby providing corresponding memory states.

During each operation for switching the memory structure to a low resistance state, conductive filaments are formed randomly. Therefore, the positions and sizes of the conductive paths as produced after several set operations may be different and difficult to control, resulting in large variability in operation voltages applying to the memory structures and poor stability of the memory structures. Also, the conductive path formed in the resistance-switching layer includes not only the main part for connecting the two electrodes (e.g. an upper electrode and a lower electrode) but also some branched parts that extend from the main part and diffuse laterally. Accordingly, the conductive paths of adjacent memory structures easily interfere with each other. For example, during a process for reading a certain memory structure, the resistance value of the reading may be wrong due to the faulty connection between the branched parts of the conductive paths of adjacent memory structures, thereby decreasing the yield and reliability of the memory structures. Therefore, it is important for the manufactures to prevent the situations and solve the problems as described above.

SUMMARY

In some embodiments of the disclosure, a conductive bridge random access memory is provided. The conductive bridge random access memory includes a bottom electrode, an inter-metal dielectric, a resistance switching assembly, and a top electrode. In some embodiments, the bottom electrode is disposed on a substrate, and the inter-metal dielectric is disposed above the bottom electrode. In some embodiments, the resistance switching assembly is disposed on the bottom electrode and positioned in the inter-metal dielectric. Also, the resistance switching assembly has a reverse T-shape cross-section. In some embodiments, the top electrode is disposed above the resistance switching assembly and the inter-metal dielectric.

In some embodiments of the disclosure, a method of manufacturing a conductive bridge random access memory is provided. In some embodiments, the method includes forming a bottom electrode on a substrate, and forming an inter-metal dielectric above the bottom electrode. In some embodiments, the method further includes forming a resistance switching assembly on the bottom electrode and in the inter-metal dielectric, wherein the resistance switching assembly has a reverse T-shape cross-section. In some embodiments, the method further includes forming a top electrode above the resistance switching assembly and the inter-metal dielectric.

BRIEF DESCRIPTION OF THE DRAWINGS

The present disclosure can be further understood by reading the subsequent detailed description and examples with references made to the accompanying drawings, wherein.

DETAILED DESCRIPTION

The present disclosure is described in detail with reference to the figures of the embodiments of the present disclosure. It should be appreciated, however, that the present disclosure can be embodied in a wide variety of implements and is not limited to embodiments described in the disclosure. Various features may be arbitrarily drawn at different scales for the sake of simplicity and clarity. Some embodiments are described below. Throughout the various views and illustrative embodiments, similar reference numbers are used to designate similar features/components.

Embodiments of the present disclosure provide a conductive bridge random access memory that not only confines positions for forming the conductive paths but also controls the breaking positions of the conductive paths. Therefore, resistance states of the memory structure can be switched stably, variations of operation voltages applied to different memory structure can be reduced, and stability of memory structures can be increased, thereby improving the yield and reliability of the final product.

In addition, a conductive bridge random access memory provided herein may include one or more memory structures. The accompanying drawings of the embodiments depict two memory structures for illustration. Each of the memory structures includes a bottom electrode, a top electrode and a resistance-switching layer disposed between the bottom electrode and the top electrode. Also, the resistance-switching layers of the memory structures are separated from each other by an inter-metal dielectric. The details will be described later. To simplify the description, methods of manufacturing a single memory structure and relevant components of the memory structure are described below.

Figure 1A:
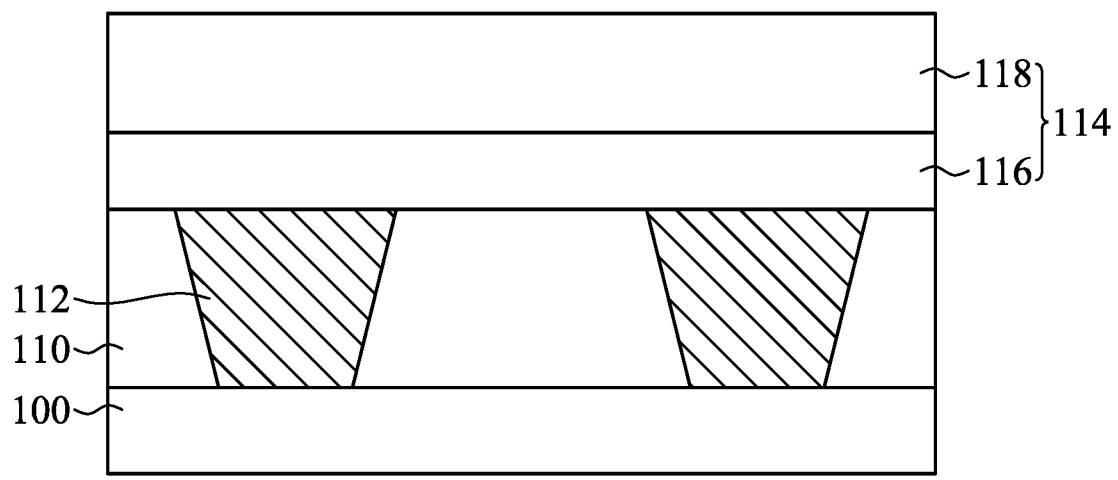
FIG. 1A-FIG. 1E are cross-sectional views of various stages of manufacturing a conductive bridge random access memory in accordance with some embodiments of the present invention.

FIG. 1A-FIG. 1E are cross-sectional views of various stages of manufacturing a conductive bridge random access memory in accordance with some embodiments of the present invention. Referring to FIG. 1A, a substrate 100 is provided. Then, an interlayer dielectric (ILD) 110 and a bottom electrode 112 are formed on the substrate 100.

In some embodiments, the substrate 100 includes a semiconductor base (not shown), active components such as transistors (not shown) on the semiconductor base and contacts (not shown) above the transistors. The bottom electrode 112 can be a metal layer of an interconnect structure on the substrate 100. Also, the bottom electrode 112 can be electrically connected to the contact and the transistor in the substrate 100 through conductive vias and/or metal lines of the interconnect structure. In some embodiments, the material of the bottom electrode 112 may include cupper, tungsten, nickel, molybdenum, platinum, titanium, tantalum, tungsten nitride, titanium nitride, tantalum nitride, another suitable conductive material, or a combination thereof. The bottom electrode layer 112 may be a single layer structure or a multilayer structure.

In some embodiments, the interlayer dielectric (ILD) 110 surrounds the bottom electrode 112. In one embodiment, an interlayer dielectric material can be deposited on the substrate 100, and then the interlayer dielectric material is patterned to form a hole. Next, a bottom electrode material is deposited on the interlayer dielectric material, and the hole is filled with the bottom electrode material. Afterward, the bottom electrode material is etched back or planarized (such as by chemical mechanical polishing) to form the bottom electrode 112 in the hole. In some embodiments, the interlayer dielectric (ILD) 110 is formed of silicon oxide, silicon nitride, silicon oxynitride, tetraethylorthosilicate (TEOS) oxide, phosphosilicate glass (PSG), borophosphosilicate glass (BPSG), fluoride-doped silicate glass (FSG), a low-k dielectric material, or a combination thereof.

Afterward, an inter-metal dielectric 114 is formed on the bottom electrode 112. In some embodiments, the inter-metal dielectric 114 includes the dielectric layers 116 and 118. In some embodiments, both the dielectric layers 116 and 118 are made of one or more materials having good barrier properties for stopping the diffusion of metal ions. For example, each of the dielectric layers 116 and 118 includes silicon carbonitride, silicon carbide, silicon nitride, silicon oxide, another suitable dielectric material, or a combination thereof. In some other embodiments, the dielectric layers 116 and 118 are made of different materials, so that the barrier properties of the dielectric layer 118 for stopping the diffusion of metal ions is better than the barrier properties of the dielectric layer 116 for stopping the diffusion of metal ions.

Next, a patterning process is performed on the inter-metal dielectric 114 to form a through hole exposing the bottom electrode. In some embodiments, by forming the through hole 126 having a reverse T-shape cross-section, a resistance switching assembly formed subsequently in the through hole 126 can have a reverse T-shape cross-section so that the configuration of the resistance switching assembly presents a profile of narrow neck portion. When the memory structure of the conductive bridge random access memory is under the reset operation, the conductive path will be disrupted and disconnected from the narrow neck portion of the resistance switching assembly, thereby breaking the conductive path. Thus, the narrow neck portion of the resistance switching assembly according to some embodiments functions as a control component to switch the memory structure from a low resistance state (LRS) to a high resistance state (HRS).

Figure 1B:
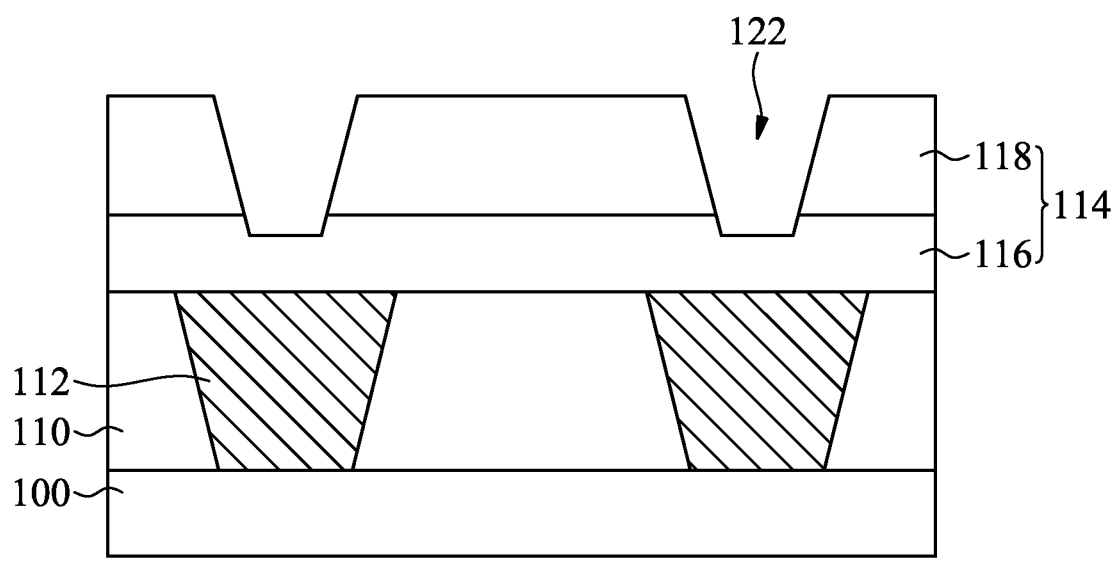

Referring to FIG. 1B, a patterning process is performed on the dielectric layer 118 to form a first hole 122. In some embodiments, a first etching step is performed on the dielectric layer 118 using a first etchant to form the first hole 122. The first hole 122 exposes an upper surface of the dielectric layer 116 and has tapered sidewalls. Also, the position of the first hole 122 is corresponding to the position of the bottom electrode 112. For example, the first hole 122 is positioned right over (e.g. directly above) the bottom electrode 112.

Figure 1C:
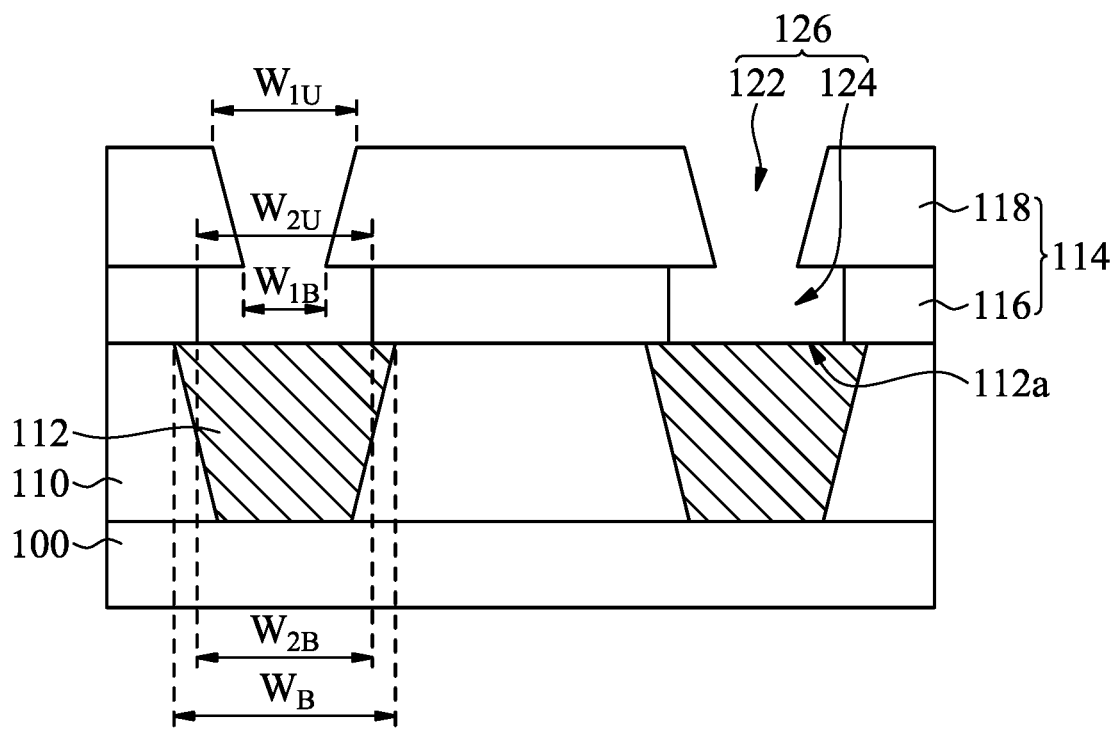

Referring to FIG. 1C, another patterning process (such as an etching process) is then performed on the dielectric layer 116 to form a second hole 124 through the first hole 122. The first hole 122 exposes an upper surface 112a of the bottom electrode 112. In some embodiments, a second etching step is performed on the dielectric layer 116 using a second etchant to form the second hole 122. In one embodiment, the first etching step and the second etching step are performed in-situ in the same etching chamber.

In addition, the first hole 122 and the second hole 124 are connected to form a through hole 126. In some embodiments, the top opening of the first hole 122 is larger than the bottom opening of the first hole 122, resulting in the tapered sidewalls of the first hole 122. Also, the bottom opening of the first hole 122 is smaller than the top opening of the second hole 124. Accordingly, the through hole 126 has a reverse T-shape cross-section. As shown in FIG. 1C, the width $W_{1U}$ of the top opening of the first hole 122 is larger than the width $W_{1B}$ of the bottom opening of the first hole 122, and the width $W_{1B}$ of the bottom opening of the first hole 122 is smaller than the width $W_{2U}$ of the top opening of the second hole 124. In this example, the width $W_{2B}$ of the bottom opening of the second hole 124 is smaller than the width $W_{2B}$ of the upper surface 112a of the bottom electrode 112. Also, in some embodiments, an area of the bottom opening of the second hole 124 is approximately equal to an area of the top opening of the first hole 122. For example, the width $W_{2B}$ of the bottom opening of the second hole 124 is approximately equal to the width $W_{1U}$ of the top opening of the first hole 122. Furthermore, when a number or a range of numbers is described with "about," "approximately," and the like, the term is intended to encompass numbers that are within a reasonable range including the number described, such as within +/−10% of the number described as understood by person skilled in the art.

It is noted that the first etching step and the second etching step are performed in-situ in the same etching chamber by using different etchants to form the through hole 126 with a reverse T-shape cross-section, but the disclosure is not limited to the aforementioned steps. In some other embodiments, the through hole 126 with a reverse T-shape cross-section can be formed by changing bias powers of the first etching step and the second etching step, or using different etchants and different bias powers of etching, or any suitable method.

Figure 1D:
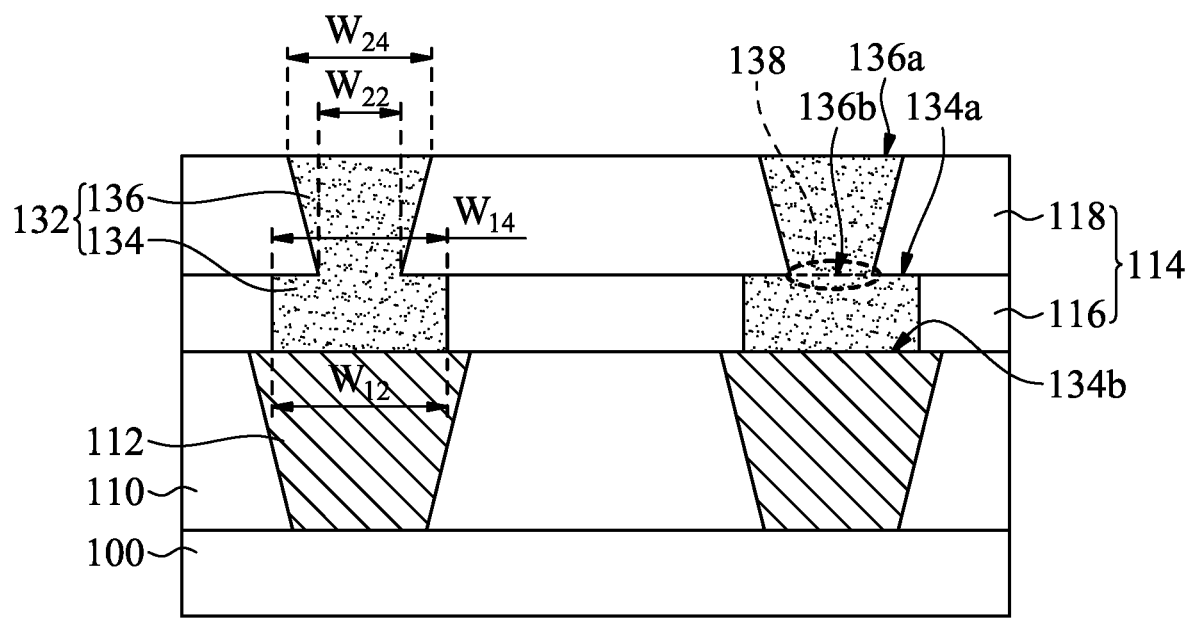

Referring to FIG. 1D, a resistance switching assembly 132 is formed in the through hole 126. In some embodiments, the resistance switching assembly 132 can be formed of a transition metal oxide, such as aluminum oxide ($Al_2O_3$), titanium dioxide ($TiO_2$), hafnium dioxide ($HfO_2$), zirconium dioxide ($ZrO_2$), tantalum dioxide ($TaO_2$), Tantalum oxide ($Ta_2O_5$) or another suitable material. Also, the resistance switching assembly 132 may be a single layer structure formed of a single material or a multilayer structure formed of several different materials. The resistance switching assembly 132 can be formed by conformably depositing the transition metal oxide on the upper surface of the inter-metal dielectric 114 and along the sidewalls and the bottom surface of the through hole 126. Afterward, the transition metal oxide is etched back or planarized (such as by chemical mechanical polishing) to remove the portion on the inter-metal dielectric 114 so as to expose the upper surface of the inter-metal dielectric 114. In some embodiments, an upper surface of the resistance switching assembly 132 and an upper surface of the inter-metal dielectric are coplanar.

In some embodiments, the resistance switching assembly 132 includes a resistance-switching layer 134 (can be referred as a first resistance-switching layer) in the second hole 124 and a resistance-switching layer 136 (can be referred as a second resistance-switching layer) in the first hole 122. The resistance-switching layer 134 is disposed on the bottom electrode 112, and contacts the upper surface 112a of the bottom electrode 112. The resistance-switching layer 136 is disposed on the resistance-switching layer 134. Also, in some embodiments, an area of the lower surface 136b of the resistance-switching layer 136 is smaller than an area of the upper surface 134a of the resistance-switching layer 134. As shown in FIG. 1D, the width $W_{22}$ of the lower surface 136b of the resistance-switching layer 136 is smaller than the width $W_{14}$ of the upper surface 134a of the resistance-switching layer 134, thereby forming a narrow neck portion 138. In this embodiment, the resistance-switching layers 134 and 136 are formed simultaneously; however, the disclosure is not limited thereto. In some other embodiments, the resistance-switching layers 134 and 136 can be formed separately.

It is noted that the resistance-switching layer 136 has tapered sidewalls because of the area of the upper surface 136a of the resistance-switching layer 136 larger than the area of the lower surface 136b of the resistance-switching layer 136. As shown in FIG. 1D, the width W24 of the upper surface 136a of the resistance-switching layer 136 is larger than the width W22 of the lower surface 136b of the resistance-switching layer 136. Therefore, an interface between the lower surface 136b of the resistance-switching layer 136 and the upper surface 134a of the resistance-switching layer 134 forms a narrowest section of the neck portion 138 of the resistance switching assembly 132. In some embodiments, the resistance switching assembly 132 (including the resistance-switching layers 134 and 136) on the bottom electrode 112 presents a profile of a reverse T-shape cross-section. The neck portion 138 of the resistance switching assembly 132 having a reverse T-shape cross-section restricts the amounts of metal ions passing through the conductive path. When the memory structure of the conductive bridge random access memory is under the reset operation, a part of the conductive path corresponding to the neck portion 138 will be disrupted first, thereby breaking the conductive path. Thus, the neck portion 138 of the resistance switching assembly functions as a control component to switch resistance states of a conductive bridge random access memory.

Additionally, in some embodiments, the width W12 of the lower surface 134b of the resistance-switching layer 134 can be approximately equal to the width W24 of the upper surface 136a of the resistance-switching layer 136.

Figure 1E:
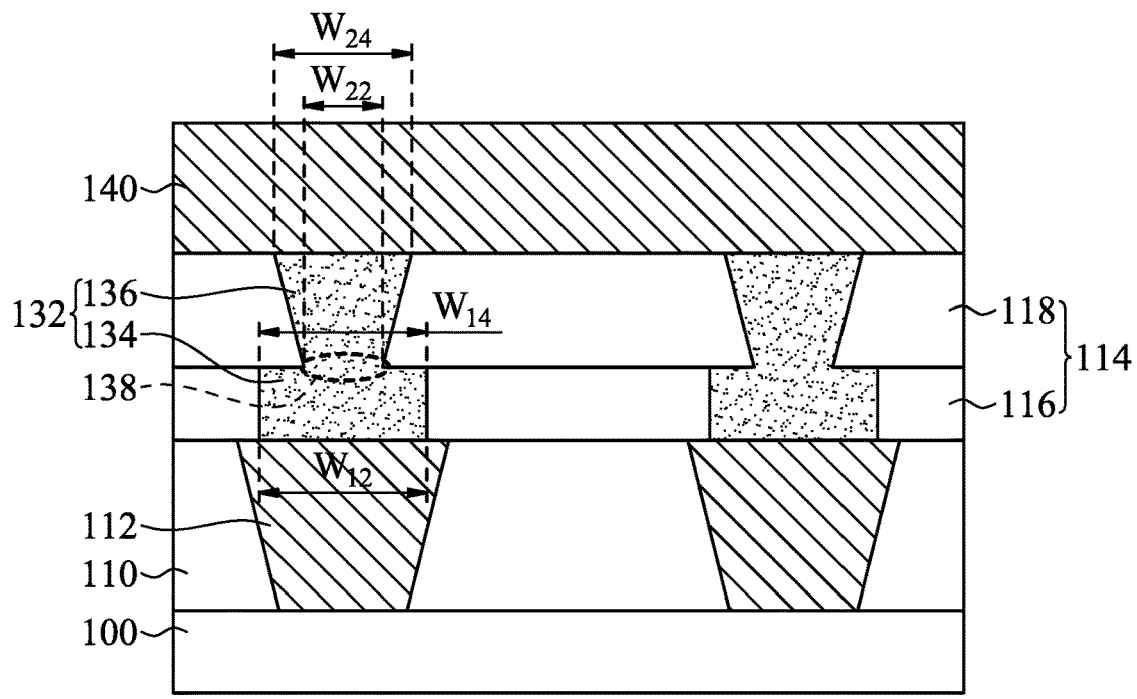

Referring to FIG. 1E, a top electrode 140 is formed on the resistance switching assembly 132 and the inter-metal dielectric 114. The top electrode 140 may include one or more metal materials that tend to diffuse into the resistance switching assembly 132. When the memory structure is under the set operation, metal ions diffused from the top electrode 140 can built a conductive path in the resistance switching assembly 132. In some embodiments, the material of the top electrode 140 may include titanium, tantalum, tungsten, aluminum, copper, titanium nitride, tantalum nitride, another suitable conductive material, or a combination thereof. Resistance states of the resistance switching assembly 132 can be switched by applying adequate voltages to the bottom electrode 112 and the top electrode 140.

In some embodiments, the top electrode 140 is formed on the dielectric layer 118 and is in direct contact with the dielectric layer 118. When the memory structure is under the set operation by applying voltages to the bottom electrode 112 and the top electrode 140, the top electrode 140 releases metal ions into the resistance switching assembly 132. Accordingly, one suggestion is to select one or more materials having good barrier properties (which stop the diffusion of metal ions) to form the dielectric layer 118 that is in direct contact with the top electrode 140, thereby stopping the diffusion of the metal material or metal ions into the dielectric layer 118. Examples of applicable materials for forming a dielectric layer 118 include silicon carbonitride, silicon carbide, silicon nitride, or a combination thereof.

Figure 2A:
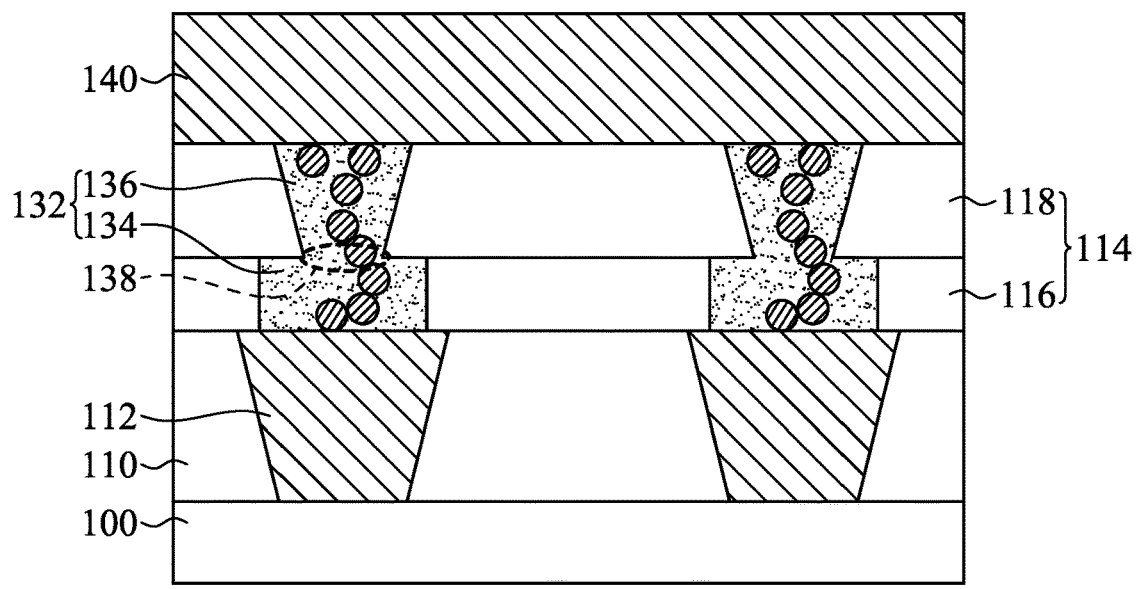
FIG. 2A is a cross-sectional view of a conductive bridge random access memory after performing the set operation in accordance with some embodiments of the present disclosure.
Figure 2B:
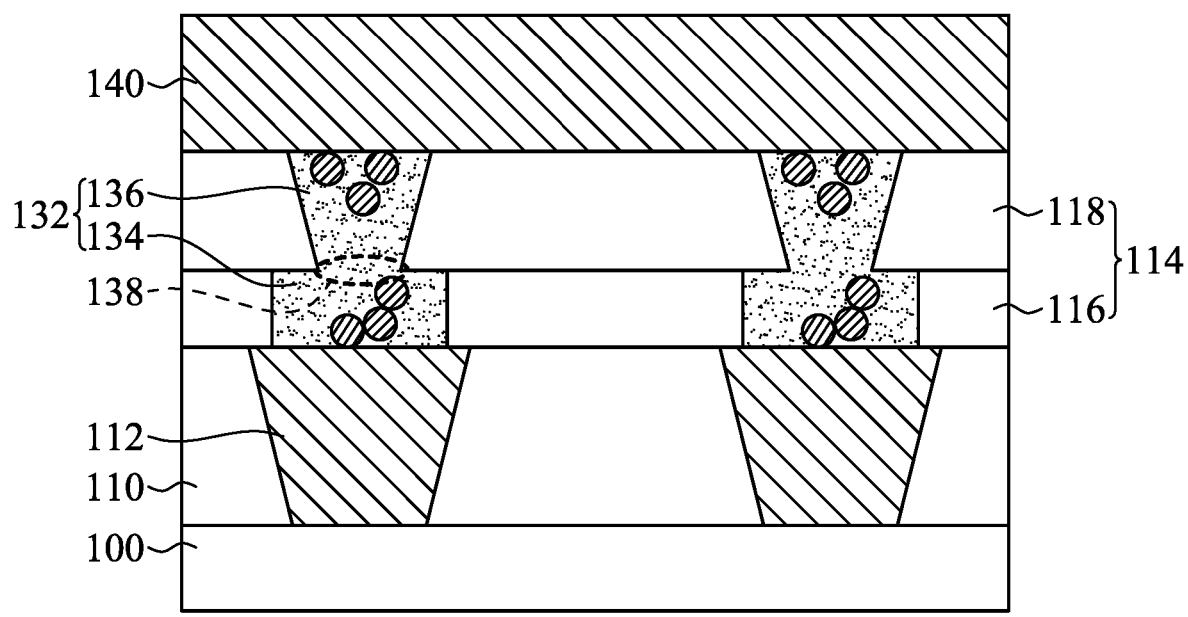
FIG. 2B is a cross-sectional view of a conductive bridge random access memory after performing the reset operation in accordance with some embodiments of the present disclosure.

Examples below are provided to describe the switch between resistance states of the resistance switching assembly when the memory structure of some embodiments is under the set operation and the reset operation. FIG. 2A is a cross-sectional view of a conductive bridge random access memory after performing the set operation in accordance with some embodiments of the present disclosure. FIG. 2B is a cross-sectional view of a conductive bridge random access memory after performing the reset operation in accordance with some embodiments of the present disclosure.

When the memory structure of the conductive bridge random access memory is under the set operation, set voltages are applied to the bottom electrode 112 and the top electrode 140, and the metal ions generated from the top electrode 140 are released into the resistance switching assembly 132. Those metal ions are aligned from the top electrode 140 towards the bottom electrode 112 and connected to each other, thereby growing conductive filaments in the resistance switching assembly 132. When the conductive filaments reach the bottom electrode 112, a conductive path is built between the top electrode 140 and the bottom electrode 112 for current to pass through, as shown in FIG. 2A, and the resistance switching assembly 132 is now in a low resistance state (LRS). In FIG. 2A, the two resistance switching assemblies 132 are formed in the positions corresponding to two memory structures and separated from each other by the inter-metal dielectric 114. Thus, positions of the conductive paths of the memory structures can be determined, thereby confining the conductive path of each of the memory structures.

When the memory structure of the conductive bridge random access memory is under the reset operation, reset voltages (e.g. opposite to the set voltages) are applied to the bottom electrode 112 and the top electrode 140, and metal ions in the resistance switching assembly 132 are reduced. Accordingly, the conductive path built in the set operation is disrupted or broken, as shown in FIG. 2B. The resistance switching assembly 132 is switched from the low resistance state (LRS) to the high resistance state (HRS).

According to some embodiments, the resistance switching assembly 132 has a reverse T-shape cross-section and a narrow neck portion 138. When the set operation is performed on the memory structure of the conductive bridge random access memory to align the metal, the conductive path is formed, wherein the narrow neck portion 138 restricts the amounts of metal ions passing through the conductive path. That is, small amounts of metal ions pass through the neck portion 138. When the reset operation is performed on the memory structure of the conductive bridge random access memory, part of the conductive path at the neck portion 138 will be disrupted easily to break the conductive path. Therefore, the neck portion 138 can be regarded as a control component to switch the resistance state of the memory structure from a low resistance state (LRS) to a high resistance state (HRS). In other words, the resistance state of the memory structure switched from the LRS to the HRS can be effectively controlled by the neck portion 138 of the resistance switching assembly 132. Also, variations for switching the resistance states between different memory structures of a conductive bridge random access memory can be reduced by forming the neck portions of the resistance switching assemblies 132.

Accordingly to some embodiments of the present disclosure, the conductive bridge random access memory has many advantages. For example, each of the resistance switching assemblies 132 in the inter-metal dielectric 114 is disposed in the position corresponding to each of the memory structures, thereby confining the position for forming conductive filaments (e.g. formed by connection of metal ions) and the conductive path of each memory structure in the low resistance state (LRS). Interference between the conductive paths of adjacent memory structures can be avoided. Therefore, during a process for reading the memory structure of the conductive bridge random access memory according to some embodiments, the resistance value of each memory structure can be obtained accurately, and the digital signal of "1" or "0" can be distinguished correctly. Furthermore, the resistance switching assembly 132 has a reverse T-shape cross-section, and the narrow neck portion 138 of the resistance switching assembly 132 restricts the amount of metal ions passing through the conductive path. Accordingly, the narrow neck portion 138 functions as a control component to switch the resistance state of the memory structure from the high resistance state (HRS) to the low resistance state (LRS) when a reset operation is performed on the memory structure.

In addition, the conductive path of the memory structure is constructed by the metal ions diffusing into the resistance switching assembly. It is suggested that the inter-metal dielectric 114 between the resistance switching assemblies 132 of adjacent memory structures is made of one or more materials having great barrier properties for stopping the diffusion of metal ions. This ensures that the metal ions can be moved in a direction that is vertical to the upper/lower surface of the resistance switching assembly of the memory structure during operation, thereby preventing the metal ions from being diffused in the horizontal direction of the resistance switching assembly, and increasing the reliability of the memory structure.

Also, take one memory structure of some embodiments as an example, the resistance-switching layer 134 and the bottom electrode 112 has a first contact area, the resistance-switching layer 136 and the top electrode 140 has a second contact area, wherein the first contact area is substantially equal to the second contact area (e.g. the width $W_{12}$ is substantially equal to the width $W_{24}$). That is, the contact resistance between the resistance switching assembly 132 and the bottom electrode 112 is substantially equal to the contact resistance between the resistance switching assembly 132 and the top electrode 140. Accordingly, the conductive bridge random access memory can be operated stably and symmetrically whether it is switched from the high resistance state to the low resistance state (set operation) or from the low resistance state to the high resistance state (reset operation). Additionally, the resistance switching assemblies of the memory structures in a conductive bridge random access memory can be formed in the same configuration, thereby reducing the operation variations for switching resistance states between different memory structures.

Additionally, according to the memory structure in the embodiment, an area of the lower surface of the resistance-switching layer 134 is smaller than an area of the upper surface 112a of the bottom electrode 112. However, the disclosure is not limited to this configuration. In some other embodiments, the area of the lower surface of the resistance-switching layer 134 can be equal to or larger than the area of the upper surface 112a of the bottom electrode 112. Another example of conductive bridge random access memory having a configuration that the lower surface of the resistance-switching layer 134 is larger than the upper surface 112a of the bottom electrode 112 is described below.

Figure 3:
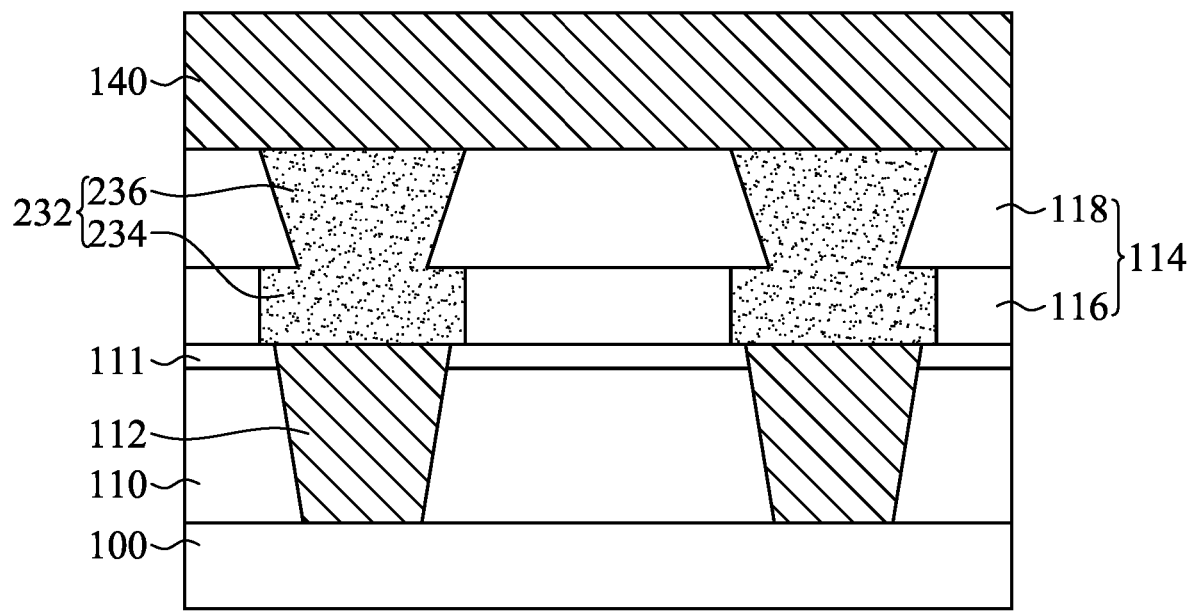
FIG. 3 is a cross-sectional view of a conductive bridge random access memory in accordance with some other embodiments of the present invention.

FIG. 3 is a cross-sectional view of a conductive bridge random access memory in accordance with some other embodiments of the present invention. The features/components in FIG. 3 identical to those in FIG. 1A-FIG. 1E and FIG. 2A-FIG. 2B are designated by the same or similar reference numbers, and the details are not repeated herein. In one example, a conductive bridge random access memory as shown in FIG. 3 further includes a diffusion barrier layer 111 on the interlayer dielectric 110, and the diffusion barrier layer 111 surrounds the bottom electrode 112. Since the lower surface of the resistance-switching layer 234 contacts parts of the upper surface of the diffusion barrier layer 111, one suggestion is to select one or more materials having good barrier properties to form the diffusion barrier layer 111, thereby stopping the diffusion of metal ions into the interlayer dielectric 110. In some embodiments, the diffusion barrier layer 111 can be made of silicon carbonitride, silicon carbide, silicon nitride, other suitable dielectric material, or a combination thereof.

As shown in FIG. 3, the dielectric layer 116 is formed on the diffusion barrier layer 111, and the lower surface of the resistance-switching layer 234 contacts the bottom electrode 112 and parts of the diffusion barrier layer 111. In one embodiment for forming the diffusion barrier layer 111, an interlayer dielectric material is deposited on the substrate 100, a diffusion barrier material is deposited on the interlayer dielectric material, and then the diffusion barrier material and the interlayer dielectric material are patterned to form a hole. Next, a bottom electrode material is deposited on the diffusion barrier material, and the hole is filled with the bottom electrode material. Afterward, the bottom electrode material is etched back or planarized (such as by chemical mechanical polishing) to form the bottom electrode 112 in the hole. To simplify the descriptions, the features/components in FIG. 3 identical or similar to those in FIG. 1A-FIG. 1E and the forming method are not redundantly repeated herein.

According to the aforementioned conductive bridge random access memory of some embodiments, the resistance switching assembly is disposed in the position corresponding to the bottom electrode, and has a narrow neck portion as a control component to switch the resistance states of the memory structure. Thus, the conductive bridge random access memory of some embodiments not only confines a position of the conductive path, but also controls the switch between the low resistance state (LRS) and the high resistance state (HRS). Also, operation variations between different memory structures of the conductive bridge random access memory can be reduced, thereby improving the yield and reliability of the final product.

While the disclosure has been described by way of example and in terms of the preferred embodiments, it should be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A conductive bridge random access memory, comprising:
    a bottom electrode disposed on a substrate;
    an inter-metal dielectric disposed above the bottom electrode, wherein the inter-metal dielectric comprises a first dielectric layer disposed on the bottom electrode and a second dielectric layer disposed on the first dielectric layer;
    a resistance switching assembly disposed on the bottom electrode and positioned in the inter-metal dielectric, the resistance switching assembly has a reverse T-shape cross-section, wherein the resistance switching assembly comprises:
        a first resistance-switching layer disposed on the bottom electrode; and
        a second resistance-switching layer disposed on the first resistance-switching layer, wherein an area of an upper surface of the second resistance-switching layer is larger than an area of a lower surface of the second resistance-switching layer, wherein the area of the lower surface of the second resistance-switching layer is smaller than an area of an upper surface of the first resistance-switching layer, wherein the first resistance-switching layer is disposed in the first dielectric layer, and wherein the second resistance-switching layer is disposed in the second dielectric layer; and
    a top electrode disposed on the resistance switching assembly and the inter-metal dielectric, wherein the first resistance-switching layer has a first contact area with the bottom electrode, the second resistance-switching layer has a second contact area with the top electrode, and the first contact area is equal to the second contact area.

2. The conductive bridge random access memory as claimed in claim 1, wherein an area of a lower surface of the first resistance-switching layer is larger than the area of the lower surface of the second resistance-switching layer.

3. The conductive bridge random access memory as claimed in claim 1, wherein the first dielectric layer and the second dielectric layer are made of different materials, and the second dielectric layer has better barrier properties than the first dielectric layer for stopping diffusion of metal ions.

4. The conductive bridge random access memory as claimed in claim 1, wherein the first dielectric layer comprises silicon carbonitride, silicon carbide, silicon nitride, silicon oxide or a combination thereof, and the second dielectric layer comprises silicon carbonitride, silicon carbide, silicon nitride, or a combination thereof.

5. The conductive bridge random access memory as claimed in claim 1, wherein an area of a lower surface of the first resistance-switching layer is equal to or smaller than a top surface of the bottom electrode.

6. The conductive bridge random access memory as claimed in claim 1, further comprising an interlayer dielectric (ILD) disposed on the substrate and surrounding the bottom electrode, wherein the inter-metal dielectric is disposed above the interlayer dielectric.

7. The conductive bridge random access memory as claimed in claim 6, further comprising a diffusion barrier layer disposed on the interlayer dielectric and surrounding the bottom electrode, wherein the inter-metal dielectric is disposed on the diffusion barrier layer, and a lower surface of the first resistance-switching layer covers the bottom electrode and contacts a portion of the diffusion barrier layer.

8. The conductive bridge random access memory as claimed in claim 1, wherein the bottom electrode and the resistance switching assembly are respectively referred as a first bottom electrode and a first resistance switching assembly, and the conductive bridge random access memory further comprises:
    a second bottom electrode disposed on the substrate and separated from the first bottom electrode; and
    a second resistance switching assembly disposed on the second bottom electrode and separated from the first resistance switching assembly by the inter-metal dielectric, wherein the second resistance switching assembly comprises:
        a third resistance-switching layer disposed on the second bottom electrode; and
        a fourth resistance-switching layer disposed on the third resistance-switching layer,
    wherein an area of a lower surface of the fourth resistance-switching layer is smaller than an area of an upper surface of the third resistance-switching layer.

9. A method of manufacturing the conductive bridge random access memory of claim 1, comprising:
    forming a bottom electrode on a substrate;
    forming an inter-metal dielectric above the bottom electrode;
    forming a resistance switching assembly on the bottom electrode and in the inter-metal dielectric, wherein the resistance switching assembly has a reverse T-shape cross-section; and
    forming a top electrode on the resistance switching assembly and the inter-metal dielectric.

10. The method of manufacturing the conductive bridge random access memory as claimed in claim 9, wherein the resistance switching assembly comprises:
    a first resistance-switching layer disposed on the bottom electrode; and
    a second resistance-switching layer disposed on the first resistance-switching layer,
    wherein an area of a lower surface of the second resistance-switching layer is smaller than an area of an upper surface of the first resistance-switching layer.

11. The method of manufacturing the conductive bridge random access memory as claimed in claim 10, wherein an area of a lower surface of the first resistance-switching layer is larger than the area of the lower surface of the second resistance-switching layer.

12. The method of manufacturing the conductive bridge random access memory as claimed in claim 10, wherein the first resistance-switching layer has a first contact area with the bottom electrode, the second resistance-switching layer has a second contact area with the top electrode, and the first contact area is equal to the second contact area.

13. The method of manufacturing the conductive bridge random access memory as claimed in claim 10, wherein forming the inter-metal dielectric comprises:
    forming a first dielectric layer on the bottom electrode; and
    forming a second dielectric layer on the first dielectric layer,
    wherein the second dielectric layer has better barrier properties than the first dielectric layer for stopping the diffusion of metal ions.

14. The method of manufacturing the conductive bridge random access memory as claimed in claim 13, wherein forming the top electrode on the resistance switching assembly and the inter-metal dielectric comprises:
    performing a first etching step on the second dielectric layer using a first etchant to form a first hole;
    performing a second etching step on the first dielectric layer using a second etchant to form a second hole under the first hole, wherein the second hole exposes the bottom electrode, and the first hole and the second hole together form a through hole; and
    filling a resistance switching material into the through hole to form the resistance switching assembly;
    wherein the second etchant is different from the first etchant, and the first etching step and the second etching step are performed in-situ in an etching chamber.

15. The method of manufacturing the conductive bridge random access memory as claimed in claim 14, wherein the conductive bridge random access memory further comprises:
    an interlayer dielectric (ILD) disposed on the substrate and surrounding the bottom electrode; and
    a diffusion barrier layer disposed on the interlayer dielectric and surrounding the bottom electrode,
    wherein after forming the second hole, a bottom opening of the second hole exposes an upper surface of the bottom electrode and a portion of an upper surface of the diffusion barrier layer.

* * * * *